(12) United States Patent
Kimura

(10) Patent No.: US 11,991,833 B2
(45) Date of Patent: May 21, 2024

(54) MOUNTING DEVICE

(71) Applicant: KAWASAKI JUKOGYO KABUSHIKI KAISHA, Kobe (JP)

(72) Inventor: Toshimitsu Kimura, Hyogo (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 655 days.

(21) Appl. No.: 16/992,121

(22) Filed: Aug. 13, 2020

(65) Prior Publication Data

US 2020/0413581 A1    Dec. 31, 2020

Related U.S. Application Data

(63) Continuation of application No. PCT/JP2019/003560, filed on Feb. 1, 2019.

(30) Foreign Application Priority Data

Feb. 14, 2018 (JP) .................................. 2018-023664

(51) Int. Cl.
  *H05K 13/04* (2006.01)
  *B25J 15/00* (2006.01)

(52) U.S. Cl.
  CPC ..... *H05K 13/0408* (2013.01); *H05K 13/0413* (2013.01); *B25J 15/0028* (2013.01)

(58) Field of Classification Search
  CPC ............. H05K 13/0408; H05K 13/0413; B25J 15/0028
  See application file for complete search history.

(56) References Cited

U.S. PATENT DOCUMENTS 3,777,350 A * 12/1973 Maeda ............... H05K 13/0473
  29/818
4,196,513 A *  4/1980 Harigane ........... H05K 13/0408
  29/837
4,286,380 A *  9/1981 Blount ................. H05K 13/041
  901/38

(Continued)

FOREIGN PATENT DOCUMENTS

GB    1576365 A * 10/1980 ......... H05K 13/0452
JP    02-063200 A    3/1990

(Continued)

*Primary Examiner* — Jeffrey T Carley
*Assistant Examiner* — Jose K Abraham
(74) *Attorney, Agent, or Firm* — XSENSUS LLP

(57) ABSTRACT

A mounting device which mounts an electronic component onto a substrate with a simple configuration, is provided. The mounting device includes a holding part configured to hold an electronic component, and a regulating part configured to regulate a radial position of a lead of the electronic component. The regulating part is capable of regulating the position of the lead at a first part, and is capable of regulating the position of the lead at a second part more distant from the holding part than the first part. By the holding part and the regulating part moving relatively to each other while the holding part holding the electronic component, the regulating part moves between a position at which the position of the lead is regulated at the first part and a position at which the position of the lead is regulated at the second part.

15 Claims, 12 Drawing Sheets

(56) References Cited

U.S. PATENT DOCUMENTS

| | | | | |
|---|---|---|---|---|
| 4,329,776 | A * | 5/1982 | Mori | H05K 13/0408 |
| | | | | 29/834 |
| 5,282,659 | A * | 2/1994 | Yasuraoka | H05K 13/0409 |
| | | | | 279/3 |
| 6,513,233 | B1 * | 2/2003 | Nakao | H05K 13/082 |
| | | | | 29/739 |
| 6,671,946 | B1 * | 1/2004 | Kadota | H05K 13/0417 |
| | | | | 29/786 |
| 8,267,452 | B2 * | 9/2012 | Weber | B25J 15/0014 |
| | | | | 294/207 |
| 8,414,044 | B2 * | 4/2013 | Weber | B65G 47/90 |
| | | | | 294/81.54 |
| 9,992,918 | B2 * | 6/2018 | Watanabe | H05K 13/0404 |
| 2015/0128411 | A1 | 5/2015 | Watanabe et al. | |
| 2016/0073511 | A1 * | 3/2016 | Watanabe | H05K 13/0404 |
| | | | | 29/739 |
| 2017/0042073 | A1 * | 2/2017 | Nagasawa | H05K 13/0417 |
| 2017/0066141 | A1 * | 3/2017 | Yokoyama | B25J 15/0475 |
| 2019/0230831 | A1 | 7/2019 | Kokushi et al. | |

FOREIGN PATENT DOCUMENTS

| | | | |
|---|---|---|---|
| JP | H0263200 A * | 3/1990 | |
| JP | 2015-095575 A | 5/2015 | |
| WO | 2017/090243 A1 | 6/2017 | |

* cited by examiner

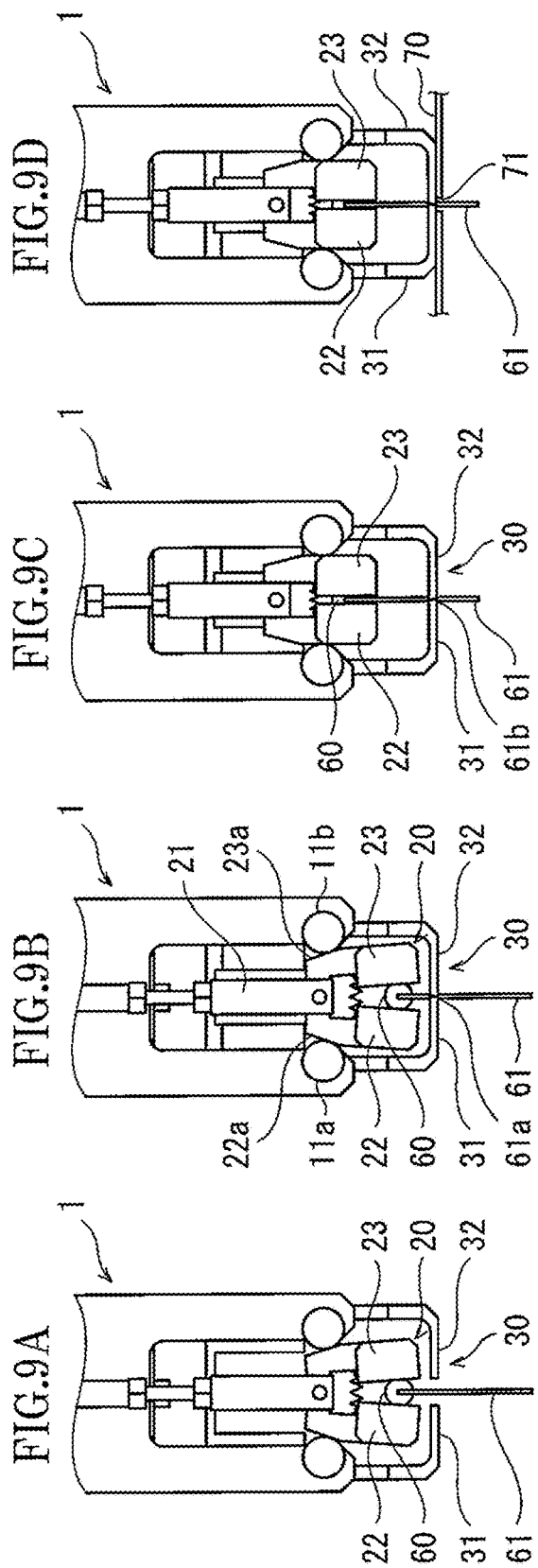
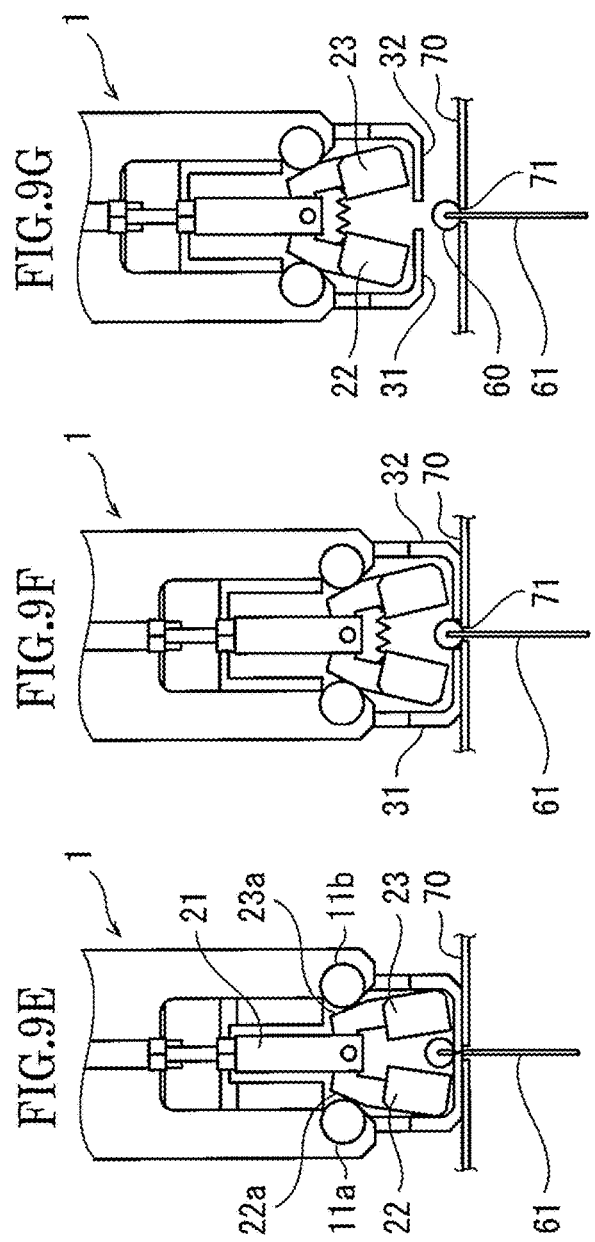

MOUNTING DEVICE

CROSS-REFERENCE TO RELATED APPLICATIONS

The present application is a bypass continuation of PCT filing PCT/JP2019/003560, filed Feb. 1, 2019, which claims priority to JP 2018-023664, filed Feb. 14, 2018, the entire contents of each are incorporated herein by reference.

TECHNICAL FIELD

The present disclosure relates to a mounting device and a mounting method which mount an electronic component onto a substrate.

BACKGROUND ART

Conventionally, devices which mount electronic components onto a substrate by using a robot have been proposed. As the device which mounts electronic components, there is a device disclosed in Patent Document 1. Patent Document 1 discloses the device which holds an electronic component, holds leads extending from the electronic component by a chuck, and inserts the held leads into insertion holes formed in a substrate, thereby mounting the electronic component onto the substrate.

REFERENCE DOCUMENT OF CONVENTIONAL ART

Patent Document

[Patent Document 1] JP2015-095575A

SUMMARY

A mounting device according to the present disclosure includes a holding part configured to hold an electronic component, and a regulating part configured to regulate a radial position of a lead of the electronic component. The regulating part is capable of regulating the position of the lead at a first part, and is capable of regulating the position of the lead at a second part more distant from the holding part than the first part. By the holding part and the regulating part moving relative to each other while the holding part holding the electronic component, the regulating part moves between a position at which the position of the lead is regulated at the first part and a position at which the position of the lead is regulated at the second part.

In the mounting device according to this configuration, since the regulating part regulates the position of the lead at the first part comparatively close to the holding part, and the regulating part regulates the position of the lead at the second part comparatively distant from the holding part by the holding part and the regulating part moving relative to each other while the holding part holding the electronic component, the position of the lead can be regulated at a plurality of positions of the lead while the holding part holding the electronic component. Therefore, the regulating position of the lead can be moved in a state where the lead is held stable. In this manner, the position of the lead can be regulated throughout the lead with sufficient accuracy so that the positioning of the lead can be performed accurately.

Moreover, the regulating part may include a first pinching part and a second pinching part, and the position of the lead may be regulated by pinching the lead between the first pinching part and the second pinching part.

The position of the lead is regulated by being pinched between the first pinching part and the second pinching part, and the lead can be certainly placed at a given position.

The regulating part may have an insertion hole at a part thereof where the first pinching part and the second pinching part pinch the lead, the lead being insertable into the insertion hole.

Since the insertion hole is formed at the part where the first pinching part and the second pinching part pinch the lead, the position of the lead can be regulated by passing the lead through the insertion hole. Therefore, it can be prevented that the lead is pressed by the first pinching part and the second pinching part, and thus, the lead can be protected.

Moreover, the mounting device may include a moving mechanism configured to move the holding part. By moving the holding part in a direction separating from the regulating part while the holding part holding the electronic component, the holding part and the regulating part may separate from each other.

Since the holding part and the regulating part separate from each other by the holding part moving in the direction separating from the regulating part, the holding part and the regulating part can be separated from each other with a simple configuration.

Moreover, the mounting device may include a biasing means configured to maintain a state where the holding part is opened, and a body part provided with a protrusion. A taper part may be formed in the holding part. The holding part may be in an open state when the holding part is in contact with the protrusion at the taper part. When the holding part moves in the direction separating from the regulating part, the holding part may contact the protrusion at a position separated from the taper part so that the holding part is closed and holds the electronic component at the center.

When the holding part moves in the direction separating from the regulating part, since the electronic component is held at the center, the holding position of the electronic component can be fixed and the holding part can hold the electronic component stable.

Moreover, the regulating part may have a first pinching part and a second pinching part, and regulate the position of the lead by pinching the lead between the first pinching part and the second pinching part. The regulating part may have an insertion hole at a part thereof where the first pinching part and the second pinching part pinch the lead, the lead being insertable into the insertion hole. The holding part may move in the direction separating from the regulating part, while the lead is inserted into the insertion hole.

Since the holding part moves in the direction separating from the regulating part while the lead is inserted into the insertion hole, it can be prevented that the lead is pressed when the holding part moves in the direction separating from the regulating part, and thus, the lead can be protected.

The first pinching part may be pivotable centering on a first rotation shaft and the second pinching part may be pivotable centering on a second rotation shaft. The first pinching part and the second pinching part may pinch the lead and regulate the position of the lead by contacting each other while being opposed to each other.

The first and second pinching parts are pivotable centering on the rotation shafts and the first and second pinching parts pivot to pinch the lead by contacting each other while being opposed to each other. Thus, the space for movements of the first and second pinching parts can be small. Therefore, when regulating the position of the lead, the space occupied by the mounting device can be reduced.

Moreover, the first pinching part may be pivotably supported by a first support part and the second pinching part may be pivotably supported by a second support part. The regulating position of the lead may be moved by moving the holding part relative to the first support part and the second support part.

The first pinching part is supported by the first support part and the second pinching part is supported by the second support part, and the regulating position of the lead is moved by moving the holding part relative to the first support part and the second support part. Thus, the regulating position of the lead can be moved with a simple configuration. Moreover, the mounting device may include a moving mechanism configured to move the holding part. The regulating position of the lead may be moved by moving the holding part.

Since the regulating position of the lead can be moved by moving the holding part, the regulating position of the lead can be changed with the simple configuration.

Moreover, a first connecting member having flexibility may be attached to the first pinching part and a second connecting member having flexibility may be attached to the second pinching part. The first pinching part may be pivoted by pulling the first pinching part through the first connecting member and the second pinching part may be pivoted by pulling the second pinching part through the second connecting member.

Since the first pinching part is moved by pulling the first pinching part through the first connecting member and the second pinching part is moved by pulling the second pinching part through the second connecting member, the first pinching part and the second pinching part can be moved with a simple configuration.

Moreover, the first connecting member may include an inward first connecting member configured to pivot the first pinching part inwardly, and an outward first connecting member configured to pivot the first pinching part outwardly. The second connecting member may include an inward second connecting member configured to pivot the second pinching part inwardly, and an outward second connecting member configured to pivot the second pinching part outwardly.

Since the first connecting member includes the inward first connecting member configured to pivot the first pinching part inwardly, and the outward first connecting member configured to pivot the first pinching part outwardly, the first pinching part can be moved both inwardly and outwardly with a simple configuration. Moreover, the second connecting member includes the inward second connecting member configured to pivot the second pinching part inwardly, and the outward second connecting member configured to pivot the second pinching part outwardly, the second pinching part can be moved both inwardly and outwardly with a simple configuration. The mounting device may be configured to be a hand part of a robot.

Since the mounting device is configured to be the hand part of the robot, the regulation of the position of the lead can be performed accurately and the mounting of the electronic component to a substrate can securely be performed.

Moreover, a mounting method according to the present disclosure is a method of mounting an electronic component by using a mounting device provided with a holding part configured to hold the electronic component, and a regulating part configured to regulate a radial position of a lead of the electronic component. The method includes the steps of holding the electronic component by the holding part, regulating the position of the lead at a first part by the regulating part, regulating, by the regulating part, the position of the lead at a second part more distant from the holding part than the first part, by moving the holding part and the regulating part relatively to each other while the holding part holding the electronic component, and mounting the electronic component onto a substrate.

In the mounting method according to this configuration, since the regulating part regulates the position of the lead at the first part comparatively close to the holding part, and the regulating part regulates the position of the lead at the second part comparatively distant from the holding part by the holding part and the regulating part moving relatively to each other while the holding part holding the electronic component, the position of the lead can be regulated at a plurality of positions of the lead while the holding part holding the electronic component. Therefore, the regulating position of the lead can be moved in a state where the lead is stably held. In this manner, the position of the lead can be regulated throughout the lead with sufficient accuracy so that the positioning of the lead can be performed accurately.

BRIEF DESCRIPTION OF THE DRAWINGS

FIGS. 9A to 9G are front views of the periphery of the holding part and the regulating part of the mounting device for respective processes when the mounting device of FIG. 1 mounts the electronic component onto the substrate.

DESCRIPTION OF EMBODIMENTS

Hereinafter, mounting devices and mounting methods of an electronic component according to embodiments of the present disclosure are described with reference to the accompanying drawings.

First Embodiment

Figure 1:
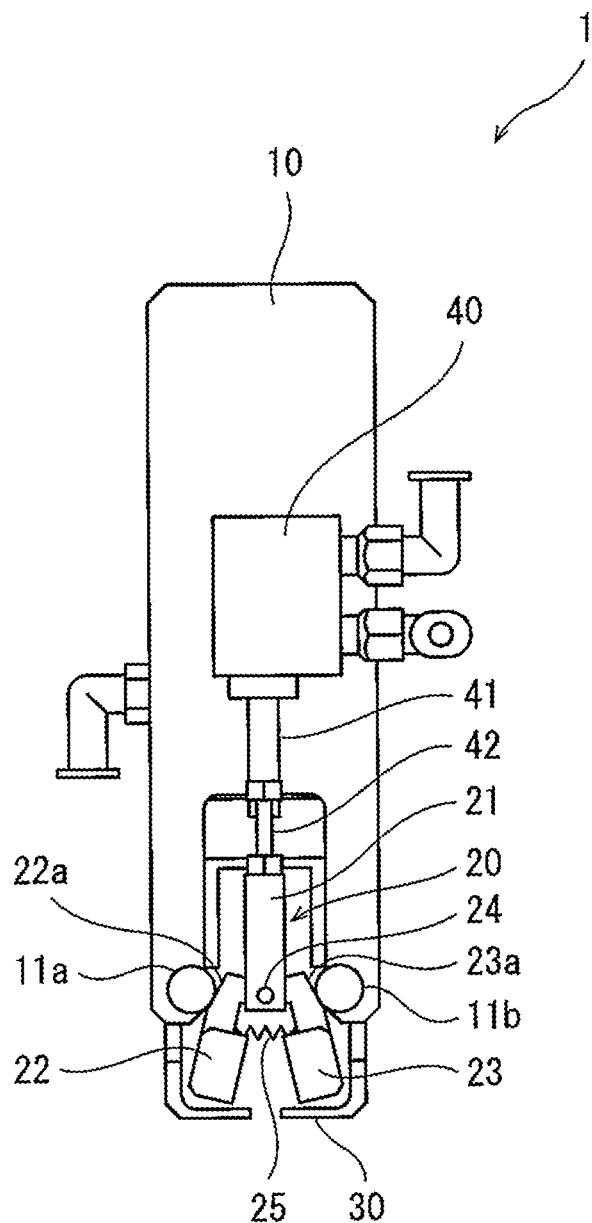
FIG. 1 is a front view of a mounting device according to a first embodiment of the present disclosure.

FIG. 1 is a front view of a mounting device 1 according to a first embodiment of the present disclosure. The mounting device 1 includes a body part 10, a holding part 20 which holds an electronic component, and a regulating part 30 which regulates the positions of leads of the electronic component.

In this embodiment, a resistor is used as the electronic component. The resistor is provided with a resistor body having an electric resistance, and is formed so that two leads extend from the resistor body. The two leads are each provided so as to extend from both side parts of the resistor body. Moreover, the two leads are bent in the same direction at side positions of the body part. Therefore, by inserting both leads which are bent in the same direction and extend in the same direction into insertion holes formed in a substrate, the resistor can be mounted onto the substrate.

Note that, in this embodiment, although the resistor is used as the electronic component, the present disclosure is not limited to this configuration. For example, the electronic component may be parts other than the resistor, such as a capacitor. Other electronic components may be used as long as the part is provided with the body part which demonstrates the function of the electronic component, and the leads extending from the body part.

The body part 10 of the mounting device 1 is formed in a plate-like shape. A holding part actuator (moving mechanism) 40 which drives the holding part 20 is attached to one of the surfaces of the body part 10. The body part 10 and the holding part 20 are connected with each other through the holding part actuator 40.

Moreover, a regulating part actuator 50 which drives the regulating part 30 is attached to the other surface of the body part 10 which is opposite from the surface to which the holding part actuator 40 is attached.

Figure 2:
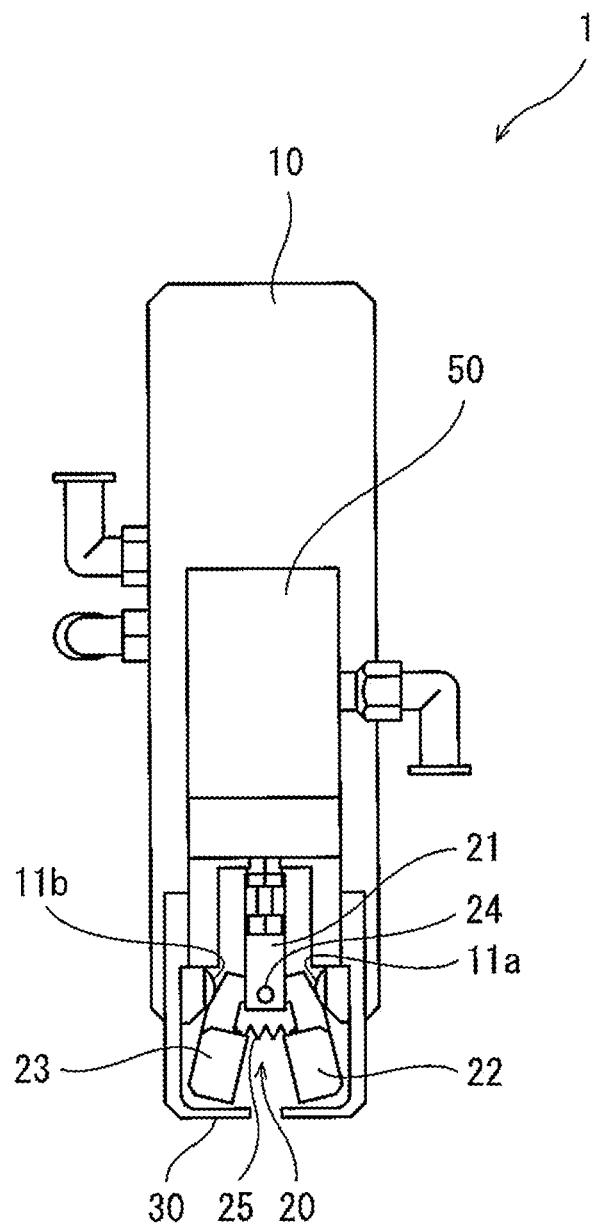
FIG. 2 is a rear view of the mounting device of FIG. 1.
Figure 3A:
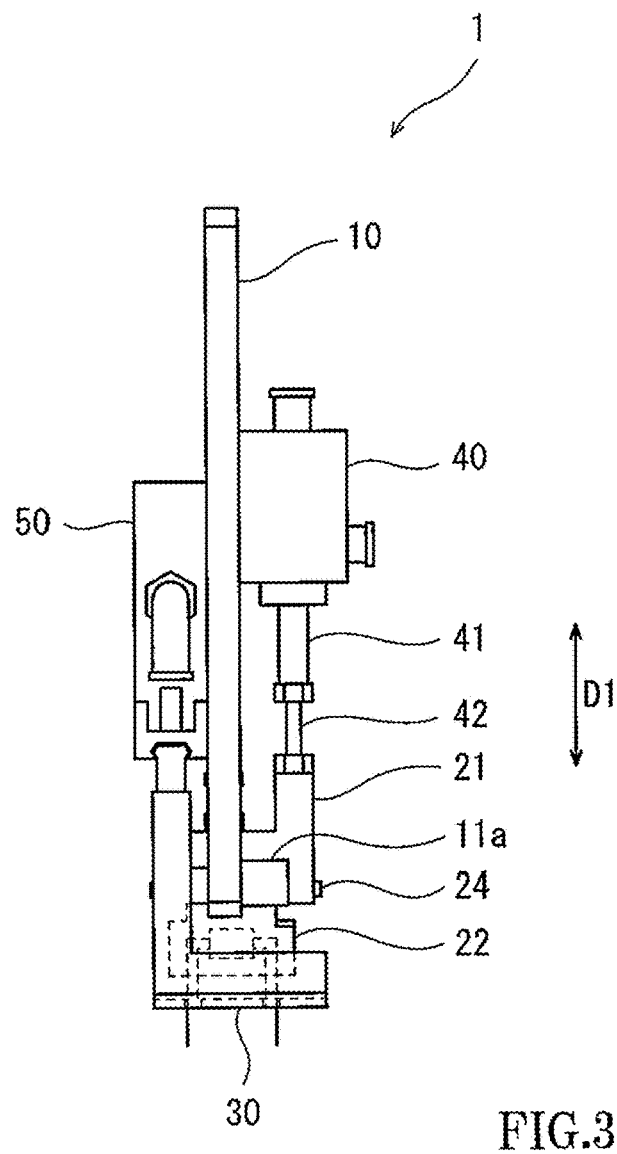
FIG. 3A is a side view of the mounting device of FIG. 1.
Figure 3B:
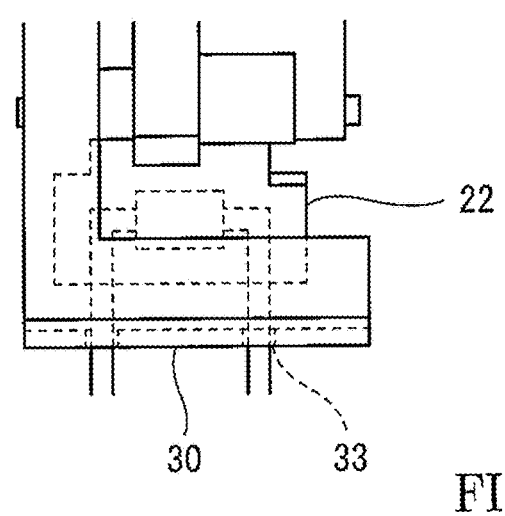
FIG. 3B is an enlarged side view of the periphery of a regulating part of FIG. 3A.

A rear view of the mounting device 1 is illustrated in FIG. 2, and side views of the mounting device 1 are illustrated in FIGS. 3A and 3B. An enlarged side view of the periphery of the regulating part 30 in FIG. 3A is illustrated in FIG. 3B. As illustrated in FIGS. 2, 3A and 3B, the body part 10 and the regulating part 30 are connected with each other through the regulating part actuator 50.

The holding part 20 includes a movable member 21, a first holding member 22, and a second holding member 23. The first holding member 22 and the second holding member 23 are attached to the movable member 21 through a rotation shaft 24.

A spring (biasing means) 25 is attached between the first holding member 22 and the second holding member 23. The first holding member 22 and the second holding member 23 are biased outwardly in the opposite directions by the spring 25. Thus, the spring 25 maintains a state where the holding part 20 is opened.

The movable member 21 is connected to the holding part actuator 40. The movable member 21 is movable by being driven by the holding part actuator 40. In this embodiment, a member 41 and a member 42 are attached to the holding part actuator 40. The member 41 is able to enter into the holding part actuator 40, and the member 41 and the member 42 are movable with respect to the holding part actuator 40. The member 41 and the member 42 are fixedly connected to each other, and each has a cylindrical shape. The member 42 is attached to the movable member 21 of the holding part 20. Moreover, the member 41 and the member 42 are movable along a D1 direction by being driven by the holding part actuator 40. In this embodiment, the member 41 and the member 42 are movable in the gravity direction.

In this embodiment, air is supplied to the holding part actuator 40, and the member 41 and member 42 move in the D1 direction by air pressure in the holding part actuator 40. Since the member 42 is connected to the movable member 21, the movable member 21 can be moved by the holding part actuator 40 moving the member 41 and the member 42. Thus, the holding part actuator 40 drives the movable member 21. Therefore, the holding part 20 can be moved by being driven by the holding part actuator 40.

The body part 10 is provided with protrusions 11a and 11b which protrude forward of the body part 10 at positions where they contact the first holding member 22 and the second holding member 23 of the holding part 20, respectively. The protrusions 11a and 11b are attached to the positions where they contact the first holding member 22 and the second holding member 23, respectively, when the movable member 21 is moved by being pulled upwardly. Tapered taper surfaces (taper parts) 22a and 23a are formed in the first holding member 22 and the second holding member 23 at positions on the side where the holding members are attached to the movable member 21. The taper surfaces 22a and 23a are each formed in a tapered shape so that a length between both the surfaces is narrowed as it goes toward the movable member 21.

Figure 4A:
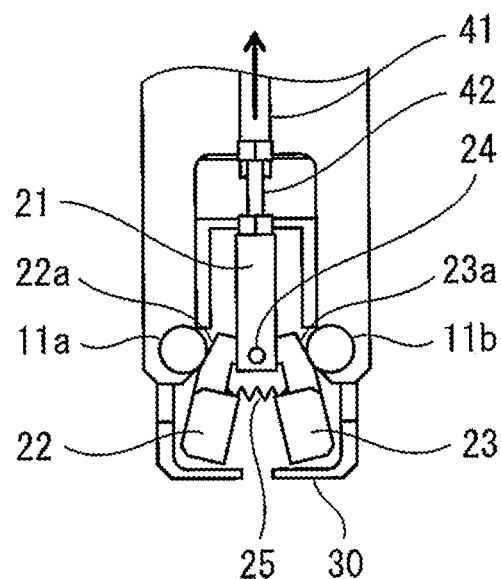
FIG. 4A is a front view of the periphery of a holding part in a state before the holding part moves in the mounting device of FIG. 1.
Figure 4B:
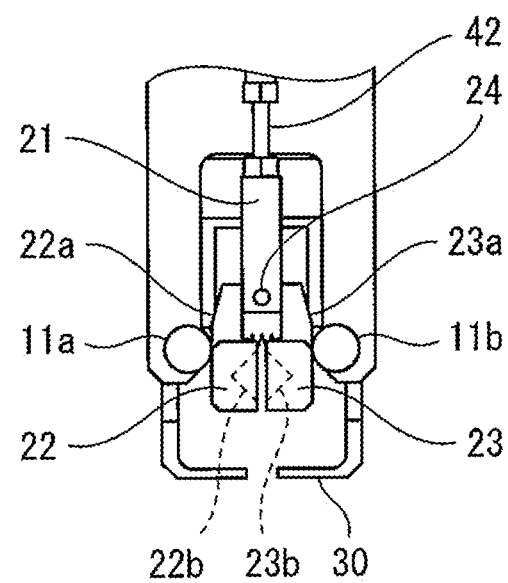
FIG. 4B is a front view of the periphery of the holding part in a state after the holding part moved.

A front view of the periphery of the holding part 20 in a state before the movable member 21 of the holding part 20 moves is illustrated in FIG. 4A, and a front view of the periphery of the holding part 20 in a state after the movable member 21 of the holding part 20 moved from the state of FIG. 4A is illustrated in FIG. 4B.

As illustrated in FIG. 4A, the protrusions 11a and 11b are located at the parts dented by the taper surfaces 22a and 23a, respectively, in the state before the movable member 21 moves. Moreover, at this time, the protrusions 11a and 11b are in contact with the taper surface 22a of the first holding member 22 and the taper surface 23a of the second holding member 23, respectively. In this state, since the first holding member 22 and the second holding member 23 are biased outwardly by the spring 25 without the taper surfaces 22a and 23a being pushed by the protrusions 11a and 11b, respectively, the state where the first holding member 22 and the second holding member 23 are opened is maintained.

As illustrated in FIG. 4B, when the movable member 21 moves toward the holding part actuator 40 by being pulled upward, the movable member 21 is further pulled upward from the state where the protrusions 11a and 11b contact the taper surface 22a of the first holding member 22 and the taper surface 23a of the second holding member 23, respectively. At this time, the taper surfaces 22a and 23a are released from the protrusions 11a and 11b, and the holding part 20 then contacts the protrusions 11a and 11b. Thus, by the first holding member 22 and the second holding member 23 being pushed inwardly by the protrusions 11a and 11b, the first holding member 22 and the second holding member 23 move inwardly.

Therefore, while the movable member 21 moves upward, the first holding member 22 and the second holding member 23 move toward the center. Thus, by being driven by the holding part actuator 40, the movable member 21 moves upwardly and the first holding member 22 and the second holding member 23 of the holding part 20 move toward the center.

The first holding member 22 and the second holding member 23 can hold the electronic component at the center. Therefore, the electronic component can be held stably, and when the electronic component is to be mounted, the electronic component can be placed on the substrate with sufficient accuracy.

Moreover, as illustrated in FIG. 4B, slope surfaces 22b and 23b are formed inside the first holding member 22 and the second holding member 23 of the holding part 20, respectively. The slope surface 22b is formed inside the first holding member 22, and the slope surface 23b is formed to the second holding member 23. Since the slope surface 22b is formed inside the first holding member 22 and the slope surface 23b is formed inside the second holding member 23, a space surrounded by the slope surfaces 22b and 23b is formed between the first holding member 22 and the second holding member 23.

The regulating part 30 is attached to the body part 10 through the regulating part actuator 50. The regulating part 30 includes a first regulating member (first pinching part) 31 and a second regulating member (second pinching part) 32. By being driven by the regulating part actuator 50, the first regulating member 31 and the second regulating member 32 of the regulating part 30 can be moved. In this embodiment, air is supplied to the regulating part actuator 50, and the first regulating member 31 and the second regulating member 32 are driven by air pressure in the regulating part actuator 50.

Figure 5A:
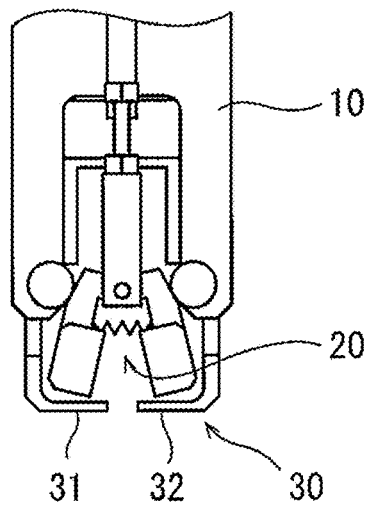
FIG. 5A is a front view of the periphery of the regulating part in a state before the regulating part moves in the mounting device of FIG. 1.
Figure 5B:
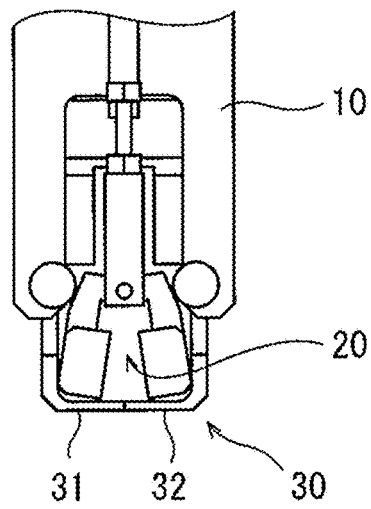
FIG. 5B is a front view of the periphery of the regulating part in a state after the regulating part moved.
Figure 5C:
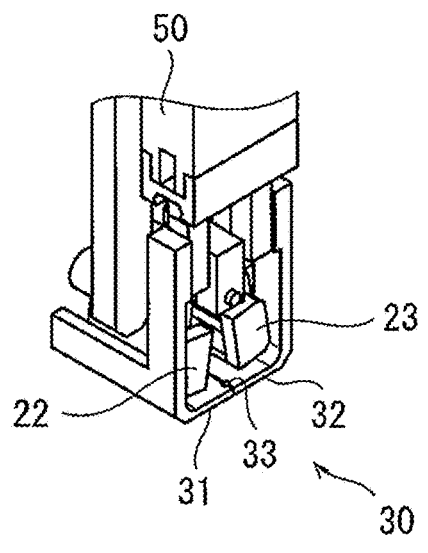
FIG. 5C is a perspective view of the periphery of the regulating part in the state after the regulating part moved.

A front view of the periphery of the regulating part 30 in a state before the regulating part 30 moves is illustrated in FIG. 5A, and a front view of the periphery of the regulating part 30 in a state after the regulating part 30 has moved from the state of FIG. 5A is illustrated in FIG. 5B. Moreover, a perspective view of the periphery of the regulating part 30 in the state after the regulating part 30 has moved is illustrated in FIG. 5C. In the state before the regulating part 30 moves, the first regulating member 31 and the second regulating member 32 are biased outwardly by spring(s) (not illustrated).

In this embodiment, the first regulating member 31 and the second regulating member 32 of the regulating part 30 move toward the center from the outside positions, and contact each other at the center location. Since the first regulating member 31 and the second regulating member 32 are biased by the spring(s) when the regulating part actuator 50 does not drive, they are located at the outermost locations.

When the first regulating member 31 and the second regulating member 32 are driven by the regulating part actuator 50, the first regulating member 31 and the second regulating member 32 move inwardly. By the first regulating member 31 and the second regulating member 32 moving inwardly, the first regulating member 31 and the second regulating member 32 contact each other at the center. At this time, by pinching the leads by the first regulating member 31 and the second regulating member 32, the positions of the leads can be regulated in the radial direction of the leads.

Moreover, as illustrated in FIG. 5C, insertion holes 33 into which the leads can be inserted are formed at locations in the first regulating member 31 and the second regulating member 32 where the regulating members contact each other. The insertion holes 33 are formed at the contacting part of the first regulating member 31 and the second regulating member 32 so that the leads can pass therethrough. In this embodiment, when the half of the insertion hole 33 is formed in the first regulating member 31, and the half of the insertion hole 33 is similarly formed in the second regulating member 32, and when the first regulating member 31 and the second regulating member 32 contact each other, one insertion hole 33 is formed.

The leads are pinched by the first regulating member 31 and the second regulating member 32 in a state where they pass through the insertion holes 33. Moreover, the positions of the leads are regulated within ranges inside the insertion holes 33. In this embodiment, the electronic component has the two leads extended from the resistor body. Therefore, the two insertion holes 33 are formed in the first regulating member 31 and the second regulating member 32 corresponding to the two leads.

In this embodiment, the first regulating member 31 and the second regulating member 32 will not be deformed, and they move to and contact each other while maintaining their shapes to regulate the positions of the leads.

The mounting device 1 configured as described above is gripped by a robot 100, and the robot 100 uses the mounting device 1 to mount the electronic component onto the substrate.

Figure 6:
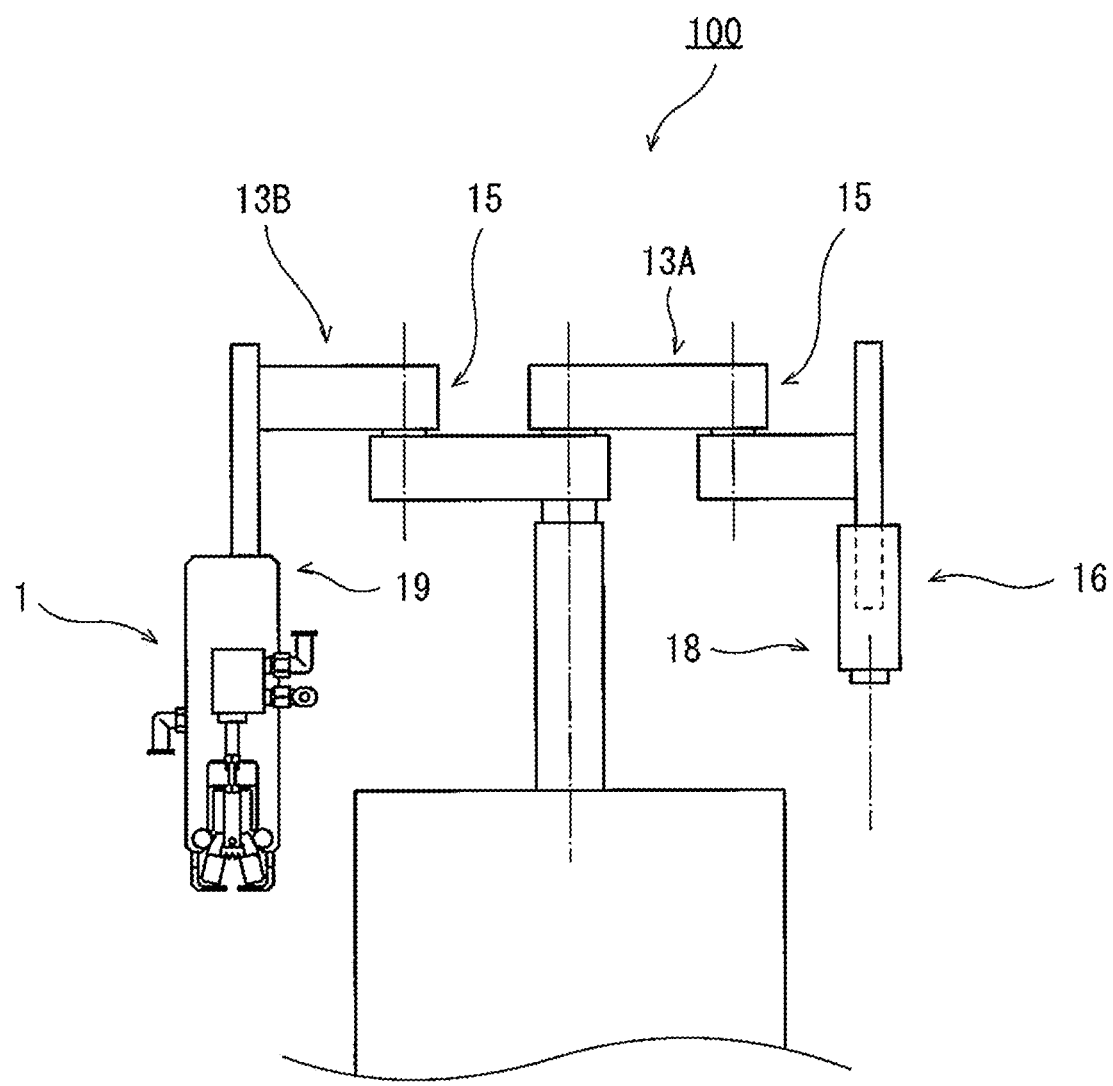
FIG. 6 is a front view of a robot which grips the mounting device of FIG. 1 as a hand part.

A front view of the robot 100 which grips the mounting device 1 and mounts the electronic component onto the substrate by using the mounting device 1 is illustrated in FIG. 6. As illustrated in FIG. 6, the robot 100 is a horizontal articulated dual-arm robot having a pair of robotic arms 13. The robot 100 has a first robotic arm 13A and a second robotic arm 13B.

The first robotic arm 13A moves a first holding part 18 within a given operating range. Moreover, the second robotic arm 13B moves the second holding part 19 within a given operating range. The robotic arm 13 is, for example, a horizontal articulated robotic arm, and includes an arm part 15 and a wrist part 16. Moreover, the first robotic arm 13A and the second robotic arm 13B can operate independently or dependently.

The first holding part 18 and the second holding part 19 are each grippable of the hand part having a function. In this embodiment, the second holding part 19 grips the mounting device 1.

The arm parts 15 position the wrist parts 16 attached to tip-end parts of the first robotic arm 13A and the second robotic arm 13B at arbitrary positions within the operating ranges.

Figure 7:
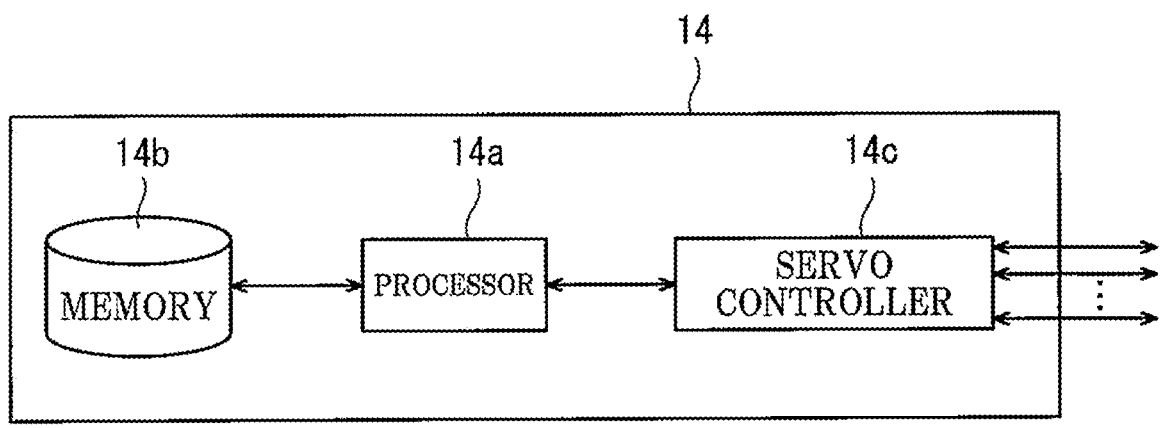
FIG. 7 is a block diagram illustrating a configuration of a control system in the robot of FIG. 6.

Next, a control unit 14 which controls operation of the robot 100 is described. FIG. 7 is the block diagram schematically illustrating one example of a configuration of a control system of the robot 100.

As illustrated in FIG. 7, the control unit 14 of the robot 100 includes a processor 14a, a memory 14b, and a servo controller 14c.

For example, the control unit 14 is a robot controller provided with a computer, such as a microcontroller. Note that the control unit 14 may be comprised of a sole control unit 14 which carries out a centralized control, or may be comprised of a plurality of control units 14 which collaboratively carry out a distributed control. The functionality of the elements disclosed herein including but not limited to the control unit 14 may be implemented using circuitry or processing circuitry which includes general purpose processors, special purpose processors, integrated circuits, ASICs ("Application Specific Integrated Circuits"), conventional circuitry and/or combinations thereof which are configured or programmed to perform the disclosed functionality. Processors are considered processing circuitry or circuitry as they include transistors and other circuitry therein. In the disclosure, the circuitry, units, or means are hardware that carry out or are programmed to perform the recited functionality. The hardware may be any hardware disclosed herein or otherwise known which is programmed or configured to carry out the recited functionality. When the hardware is a processor which may be considered a type of circuitry, the circuitry, means, or units are a combination of hardware and software, the software being used to configure the hardware and/or processor.

The memory 14b stores information on a basic program as a robot controller, various fixed data, etc. The processor 14a controls various operations of the robot 100 by reading and executing software, such as the basic program stored in the memory 14b. That is, the processor 14a generates a control command of the robot 100, and outputs it to the servo controller 14c. The memory 14b can be a memory device such as a ROM, a RAM, etc.

The servo controller 14c controls the drive of the servomotors corresponding to respective joints of the first robotic arm 13A and the second robotic arm 13B of the robot 100 based on the control command generated by the processor 14a.

Operation for mounting an electronic component 60 onto the substrate by using the mounting device 1 having the above configuration is described.

Figure 8:
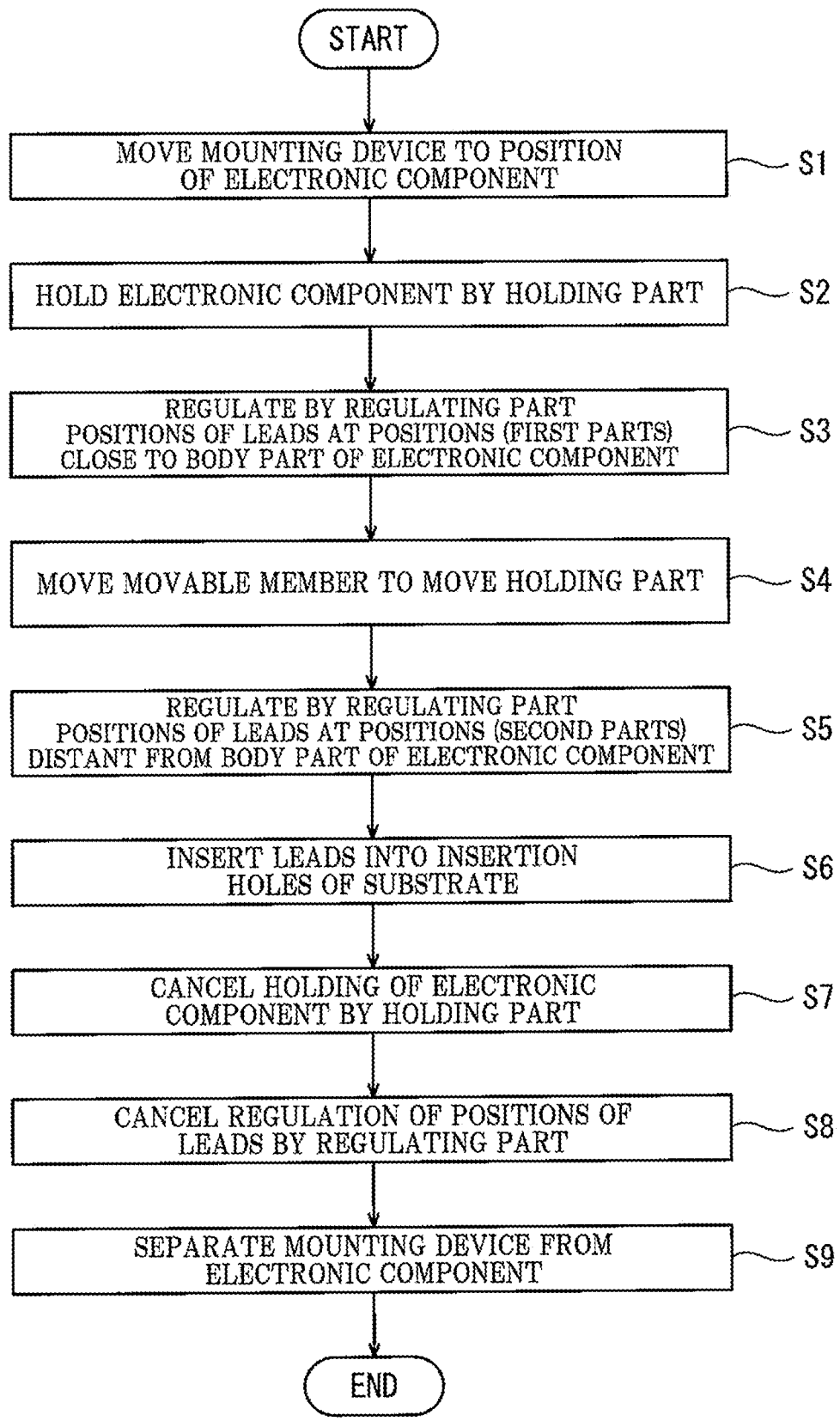
FIG. 8 is a flowchart illustrating a flow when the mounting device of FIG. 1 mounts an electronic component onto a substrate.

A flowchart of a flow when the mounting device 1 mounts the electronic component onto the substrate is illustrated in FIG. 8. Moreover, front views of the periphery of the holding part 20 and the regulating part 30 of the mounting device 1 are illustrated in FIGS. 9A to 9G, for respective processes during which the mounting device 1 inserts leads 61 of the electronic component 60 into the insertion holes of the substrate and mounts the electronic component 60 onto a substrate 70.

First, the mounting device 1 moves toward a position where the electronic component is disposed (S1). When the mounting device 1 moves, and the first holding member 22 and the second holding member 23 of the holding part 20 of the mounting device 1 reaches a position at which they can hold the electronic member therebetween, the holding part 20 holds the electronic component ((S2): Holding Step). The mounting device 1 in a state where the holding part 20 holds the electronic component between the first holding member 22 and the second holding member 23 is illustrated in FIG. 9A. At this time, the holding part 20 holds the body part of the electronic component 60 so that the first holding member 22 and the second holding member 23 pinches the body part of the electronic component 60.

When the holding part 20 holds the body part of the electronic component 60, the regulating part 30 pinches the leads 61 of the electronic component 60 by the first regulating member 31 and the second regulating member 32, and then regulates the positions of the leads 61. The mounting device 1 in which the first regulating member 31 and the second regulating member 32 regulate the positions of the leads 61 are illustrated in FIG. 9B. The insertion holes 33 are formed in the contacting part between the first regulating member 31 and the second regulating member 32 of the regulating part 30. The leads 61 are disposed so as to pass through the insertion holes 33. Therefore, the radial positions of the leads 61 are regulated within the ranges of the insertion holes 33.

In this embodiment, as illustrated in FIG. 3B, the two leads 61 are pinched between the first regulating member 31 and the second regulating member 32 of the regulating part 30 so that the radial position of each lead 61 is regulated. The two leads 61 are disposed passing through the insertion holes 33, and their radial positions are regulated by the insertion holes 33.

At this time, the movable member 21 does not move upwardly. Therefore, while the holding part 20 holding the electronic component 60, the positions of the leads 61 are regulated at parts (first part) 61a close to the holding part 20. That is, the positions of the leads 61 are regulated at the parts (first parts) 61a close to the body part 62 of the electronic component 60 (First Part Regulating Step). Thus, the first regulating member 31 and the second regulating member 32 of the regulating part 30 regulate the radial positions of the leads 61 at the parts 61a of the leads 61 comparatively close to the holding part 20.

Generally, the leads 61 are not positionally deviated and seldom radially offset at the parts 61a close to the holding part 20. On the other hand, the possibility that parts 61b of the leads 61 distant from the holding part 20 (described later) are deviated from given positions is comparatively high. At the parts 61a comparatively close to the holding part 20, a comparatively large force is required for deforming the leads 61. Moreover, at the parts 61a close to the holding part 20, a deformation of the leads 61 are comparatively small, when an external force acts on the leads 61 and the deformation is caused at the leads 61.

The parts of the leads 61 distant from the holding part 20 are deformed, even if the external force which acts thereon is small. Moreover, at the parts distant from the holding part 20, the deformation is comparatively large when the deformation occurs. Therefore, the leads 61 are difficult to be deformed at the parts close to the holding part 20 and easy to be deformed at the parts distant from the holding part 20.

Therefore, at the parts 61a close to the holding part 20, a spacing between the two leads 61 is kept constant. Therefore, the leads 61 are easily pinched between the first regulating member 31 and the second regulating member 32, and the positioning of the leads 61 are easily performed. Moreover, at the parts 61a close to the holding part 20, the leads 61 are easily disposed inside the insertion holes 33.

When the regulating part 30 regulates the positions of the leads 61 at the parts 61a close to the holding part 20, the movable member 21 is moved so as to be pulled upwardly while the leads 61 are inserted into the insertion holes 33 of the regulating part 30 to slidingly move the holding part 20 so as to pull it upwardly (S4).

The mounting device 1 in a state where the holding part 20 is pulled upwardly and the holding part 20 is moved is illustrated in FIG. 9C. At this time, the holding part 20 is pulled upwardly while holding the body part of the electronic component 60. Accordingly, the first holding member 22 and the second holding member 23 move upwardly. Therefore, the first holding member 22 and the second holding member 23 move from a position at which the protrusions 11a and 11b enter into the dented parts by the taper surfaces 22a and 23a to a position at which the first holding member 22 and the second holding member 23 are pushed inwardly by the protrusions 11a and 11b.

By the movable member 21 moving upwardly, the movable member 21 is pulled upwardly from the position at which the protrusions 11a and 11b contact the taper surface 22a of the first holding member 22 and the taper surface 23a of the second holding member 23. The protrusions 11a and 11b push the first holding member 22 and the second holding member 23 inwardly, and the first holding member 22 and the second holding member 23 move inwardly. Thus, when the holding part 20 moves in a direction separating from the regulating part 30, the first holding member 22 and the second holding member 23 contact the protrusions 11a and 11b at the positions separated from the taper surfaces 22a and 23a, and therefore, the first holding member 22 and the second holding member 23 are closed. Therefore, the first holding member 22 and the second holding member 23 hold the electronic component 60 at the inward positions, and as a result, the first holding member 22 and the second holding member 23 hold the electronic component 60 at the center location.

Moreover, while the body part of the electronic component 60 is held by the holding part 20, the holding part 20 moves in a direction away from the regulating part 30. Therefore, the parts of the leads 61 where the radial positions are regulated by the regulating part 30 are moved.

Since the holding part 20 moves in the direction away from the regulating part 30 while holding the body part of the electronic component 60, the regulating part 30 regulates the radial positions of the leads 61 at the parts moved in the direction away from the holding part 20. Therefore, the radial positions of the leads 61 are regulated at the parts (second part) 61b comparatively far from the body part of the electronic component 60 held by the holding part 20 (S5). That is, the regulating part 30 regulates the radial positions of the leads 61 at the parts (second parts) 61b farther from the holding part 20 than the parts (first parts) 61a which are regulated before the regulating part 30 is moved (Second Part Regulating Step).

Thus, by the holding part 20 and the regulating part 30 moving relative to each other, the regulating part 30 is movable between the position at which the positions of the leads 61 are regulated at the parts 61a close to the holding part 20 and the position at which the positions of the leads 61 are regulated at the parts 61b separated from the holding part 20. In this embodiment, the holding part 20 and the regulating part 30 separate from each other by moving the holding part 20 in the direction away from the regulating part 30 while holding the electronic component 60.

Moreover, in this embodiment, the regulating positions of the leads 61 by the regulating part 30 can be changed, while the holding part 20 holding the electronic component 60, and therefore, the regulating positions of the leads 61 can be changed while the electronic component 60 is stably held by the holding part 20. Moreover, after the regulating part 30 regulates the positions of the leads 61 at the parts 61a comparatively close to the holding part 20, the regulating part 30 is slid while the regulating part 30 does not release the leads 61, and regulates the radial positions of the leads 61 at the parts 61b comparatively far from the holding part 20. Thus, by the regulating part 30 being slid along the leads 61 while the regulating part 30 does not release the leads 61, the regulating positions of the leads 61 can be changed. Therefore, after positioning of the leads 61 is accurately performed at the parts 61a comparatively close to the holding part 20, the positional accuracy of the regulation of the positions of the leads 61 by the regulating part 30 is kept exact also at the parts 61b comparatively far from the holding part 20. Therefore, the positioning of the leads 61 can be accurately performed at the parts 61b comparatively far from the holding part 20. Moreover, since the regulating part 30 is slid along the leads 61 while the regulating part 30 does not release the leads 61 to change the regulating positions of the leads 61, the positioning of the leads 61 can be accurately performed throughout the length of the leads 61.

Moreover, in this embodiment, the electronic component 60 of which the two leads 61 extend from the body part is used. Therefore, by sliding the regulating part 30 along the leads 61 while the regulating part 30 does not release the leads 61 to change the regulating positions of the leads 61, the regulating positions of the leads 61 can be changed while the spacing between the leads 61 is maintained. Therefore, the spacing between the leads 61 can be maintained throughout the length of the leads 61. Since the spacing between the leads 61 is kept constant throughout the length of the leads 61, the mounting of the electronic component 60 can be performed accurately by positioning the mounting device 1 accurately.

Since the radial positions of the leads 61 are regulated not only at the parts (first parts) 61a comparatively close to the holding part 20 but also at the parts (second parts) 61b comparatively far from the holding part 20, the radial positions are regulated throughout the length of the leads 61. Since the positioning of the leads 61 in the radial direction is performed in this way, the leads 61 extending from the electronic component 60 can be inserted easily into the insertion holes formed in the substrate by placing the mounting device 1 at the given position of the substrate.

When the electronic component 60 is held by the mounting device 1 and the movable member 21 moves, the movable member 21 moves upward while the leads 61 of the electronic component 60 are inserted into the insertion holes 33. Therefore, the positions of the leads 61 of the electronic component 60 are regulated by the positions of the insertion holes 33 so that the positions of the leads 61 are corrected. Therefore, when the positions of the leads 61 are regulated, the robot 100 can easily grasp the positions of the leads 61. Therefore, by the robot 100 placing the mounting device 1 at the given position of the substrate, the leads 61 can be easily inserted into the insertion holes formed in the substrate.

When inserting the leads 61 extending from the electronic component 60 held by the mounting device 1 into the insertion holes of the substrate, the mounting device 1 is moved to the position at which the leads 61 can be inserted into the insertion holes of the substrate.

A front view of the mounting device 1 in a state where the leads 61 of the electronic component 60 are inserted into insertion holes 71 of the substrate 70 is illustrated in FIG. 9D. By moving the mounting device 1, the mounting device 1 is placed at the position where the leads 61 of the electronic component 60 oppose the insertion holes 71 of the substrate 70. When the mounting device 1 is placed at the position where the leads 61 of the electronic component 60 oppose the insertion holes 71 of the substrate 70, the mounting device 1 descends as it is, and the leads 61 are inserted into the insertion holes 71 (S6) (Mounting Step).

When the leads 61 of the electronic component 60 are inserted into the insertion holes 71 of the substrate 70, the hold of the electronic component 60 by the holding part 20 and the regulation of the positions of the leads 61 by the regulating part 30 are released. When releasing the hold of the electronic component 60 by the holding part 20, the movable member 21 moves downwardly.

A front view of the mounting device 1 in a state where the movable member 21 moves downwardly and the hold of the electronic component 60 by the holding part 20 is released is illustrated in FIG. 9E.

When the movable member 21 moves downwardly as being driven by the holding part actuator 40, the first holding member 22 and the second holding member 23 move downwardly accordingly. Therefore, the first holding member 22 and the second holding member 23 move from the position where the first holding member 22 and the second holding member 23 are pushed inwardly by the protrusions 11a and 11b to the position at which the protrusions 11a and 11b enter into the dented parts by the taper surfaces 22a and 23a. By the movable member 21 moving downwardly, the parts where the taper surfaces 22a and 23a and the protrusions 11a and 11b contact move so that the first holding member 22 and the second holding member 23 move outwardly. Thus, the first holding member 22 and the second holding member 23 are opened. Therefore, the hold of the electronic component 60 by the holding part 20 is released.

When the hold of the electronic component 60 by the holding part 20 is released, the first regulating member 31 and the second regulating member 32 move outwardly from each other. Therefore, the regulation of the positions of the leads 61 of the electronic component 60 is no longer performed.

A front view of the mounting device 1 in a state where the first regulating member 31 and the second regulating member 32 move outwardly from each other, and the regulation of the positions of the leads 61 is no longer performed is illustrated in FIG. 9F. At this time, the first regulating member 31 and the second regulating member 32 move outwardly from each other by being driven by the regulating part actuator 50.

When the hold of the electronic component 60 by the holding part 20 is released and the regulation of the positions to the leads 61 by the regulating part 30 is no longer performed, the leads 61 are inserted into the insertion holes 71, and therefore, the electronic component 60 is mounted onto the substrate 70 (S8). When the hold of the electronic component by the holding part 20 and the regulation of the positions of the leads 61 by the regulating part 30 are no longer performed, the mounting device 1 separates from the electronic component 60 (S9).

A front view of the mounting device 1 in a state where the mounting device 1 moves in the direction away from the electronic component 60 is illustrated in FIG. 9G. When the mounting device 1 separates from the electronic component 60, the mounting of the electronic component 60 onto the substrate 70 by using the mounting device 1 is finished.

Thus, the leads 61 of the electronic component 60 are inserted into the insertion holes 71 of the substrate 70 so that the electronic component 60 is mounted onto the substrate 70. Therefore, in this embodiment, since the electronic component 60 is mounted onto the substrate 70, the mounting device 1 with a simple configuration can mount the electronic component 60 onto the substrate 70.

Upon the mounting of the electronic component 60, since the electronic component 60 is held by the holding part 20 and the positions of the leads 61 of the electronic component 60 are regulated by the regulating part 30, the positions of the leads 61 of the electronic component 60 can be recognized, without using an imaging means, such as a camera. Moreover, based on the recognized positions of the leads 61, the leads 61 of the substrate 70 can be inserted into the insertion holes 71. Therefore, the electronic component 60 can be mounted onto the substrate 70, without using the imaging means. Therefore, the electronic component 60 can be mounted onto the substrate 70 by using the mounting device 1 with a simple configuration.

Moreover, according to this embodiment, the holding part 20 which holds the electronic component 60, the regulating part 30 which regulates the positions of the leads 61, and the movable member 21 which moves the holding part 20 with respect to the regulating part 30 are configured as a sole mounting device 1. Therefore, the configuration of the mounting device 1 which mounts the electronic component 60 can be simple.

Moreover, only by moving the movable member 21 while the holding part 20 holding the electronic component 60, and moving the holding part 20 in the direction away from the regulating part 30, the positioning of the leads 61 can be performed accurately throughout the leads 61. Therefore, by sliding the holding part 20 while the holding part 20 holds the leads 61 to move the electronic component 60, the regulating positions of the leads 61 can be moved. Therefore, since the regulating positions of the leads 61 can be moved in the state where the electronic component 60 is stably held, the positions of the leads 61 can be regulated throughout the leads 61 with sufficient accuracy. Therefore, the positioning of the leads 61 can be performed accurately. Moreover, the positioning of the leads 61 of the electronic component 60 can be performed accurately with a simple configuration.

Moreover, in this embodiment, the positions of the leads 61 are regulated through the insertion holes 33 formed in the first regulating member 31 and the second regulating member 32. Therefore, since the first regulating member 31 and the second regulating member 32 do not directly contact the leads 61 to regulate the positions of the leads 61, the lead 61 can be protected and the surfaces of the leads 61 will not be damaged. Moreover, since the holding part 20 moves while the leads 61 are inserted into the insertion holes 33 when moving the holding part 20, the regulating positions by the regulating part 30 can be moved, without the regulating part 30 releasing the leads 61 inside the insertion holes 33.

Note that, in this embodiment, the mounting device 1 is gripped by the robot 100, and by the robot 100 moving the mounting device 1, the held electronic component is mounted onto the substrate. However, the present disclosure may, but is not limited to, mount the electronic component by moving the mounting device 1 by using devices other than the robot.

Moreover, in this embodiment, air is supplied to the holding part actuator 40 and the regulating part actuator 50, and the holding part 20 and the regulating part 30 are driven by air pressure. However, the present disclosure is not limited to this embodiment, and the holding part 20 and the regulating part 30 may be driven by a drive source other than air pressure.

Moreover, in this embodiment, the positioning is performed by regulating the positions of the leads of the electronic component in which the two leads are extended from the body part, and the electronic component is mounted onto the substrate. However, the present disclosure is not limited to this embodiment, and the electronic component may be a type other than those having two leads. For example, an electronic component with three leads extending from the body part may also be applied to the present disclosure. Moreover, an electronic component with four or more leads extending from the body part may also be applied to the present disclosure. Moreover, an electronic component with only one lead extending from the body part may also be applied to the present disclosure.

Moreover, in this embodiment, the two insertion holes 33 are formed in the first regulating member 31 and the second regulating member 32 of the regulating part 30 corresponding to the two leads of the electronic component. However, the present disclosure is not limited to this embodiment, and the number of insertion holes 33 formed in the first regulating member 31 and the second regulating member 32 of the regulating part 30 may not be two. The number of insertion holes 33 formed in the first regulating member 31 and the second regulating member 32 of the regulating part 30 may correspond to the number of leads extending from the body part of the electronic component.

Second Embodiment

Next, a mounting device according to a second embodiment is described. Note that description of parts configured similar to the first embodiment is omitted, and only different parts are described.

In the first embodiment, in the regulating part 30, the first regulating member 31 and the second regulating member 32 move inwardly, and the positions of the leads are regulated by causing the first regulating member 31 and the second regulating member 32 contact at the center and pinch the leads therebetween. On the other hand, in the second embodiment, a regulating part 30a is provided with support parts 34a and 34b on both sides of an electronic component, and a first regulating member (first pinching part) 31a and a second regulating member (second pinching part) 32a which pinch the leads are supported pivotably to the support parts 34a and 34b. Since the first regulating member 31a and the second regulating member 32a are rotated around their rotation shafts and oppose to each other, and the first regulating member 31 and the second regulating member 32 contact so as to pinch the leads, the positions of the leads are regulated by the pinching of the leads.

Figure 10:
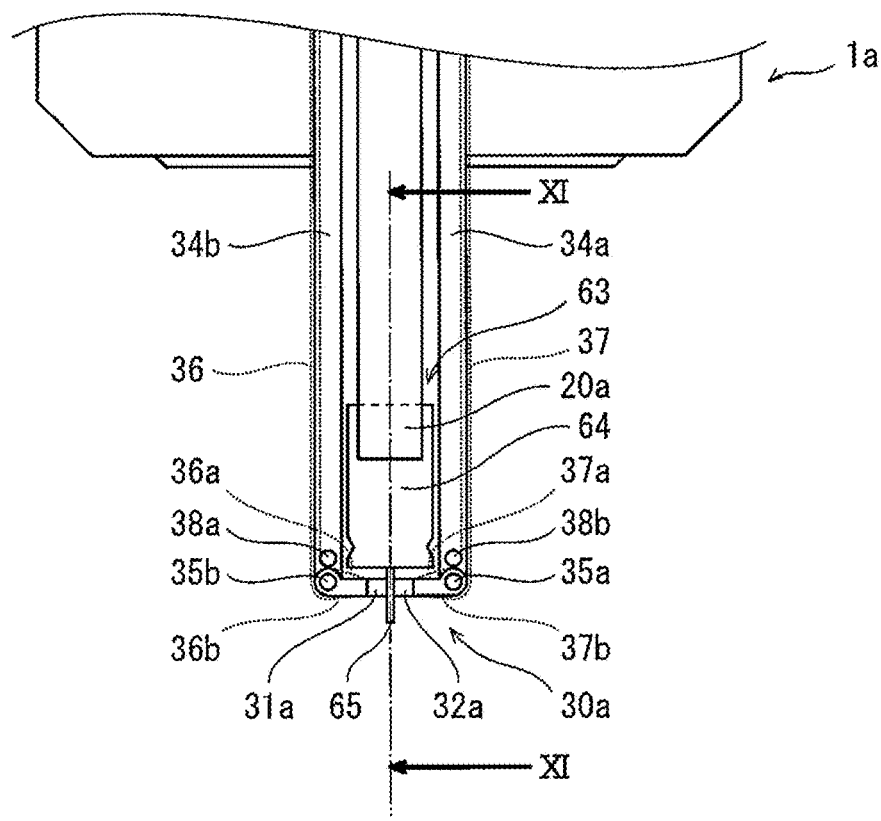
FIG. 10 is a front view of a mounting device according to a second embodiment of the present disclosure.
Figure 11:
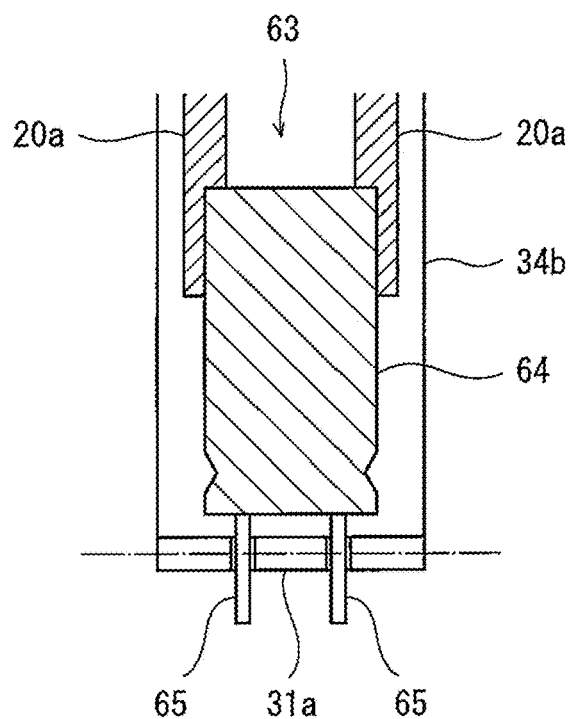
FIG. 11 is a cross-sectional view of the mounting device of FIG. 10 taken along a line XI-XI.

A front view of a mounting device 1a in the second embodiment is illustrated in FIG. 10. FIG. 10 illustrates the periphery of a holding part 20a and the regulating part 30a of the mounting device 1a. A cross-sectional view taken along a line XI-XI of the mounting device 1a in FIG. 10 is illustrated in FIG. 11.

In the second embodiment, an electronic component 63 to be mounted onto the substrate is formed so that leads 65 extend in one direction from a body part 64 which demonstrates a function of this electronic component. In this embodiment, the leads 65 extend vertically downward from the body part 64 held by the mounting device 1a. In this embodiment, the two leads 65 extend downwardly from the body part 64.

The mounting device 1a includes the holding part 20a which holds the electronic component 63, and the regulating part 30a which regulates the positions of the leads 65 of the electronic component 63.

The regulating part 30a is provided with the support parts 34a and 34b on both sides of the electronic component 63. Rotation shafts 35a and 35b are provided to tip-end parts of the support parts 34a and 34b on the side where the positions of the leads 65 of the electronic component 63 are regulated, respectively. Moreover, the first regulating member 31a and the second regulating member 32a are attached to the support parts 34a and 34b so as to be pivotable centering on the rotation shafts 35b and 35a, respectively. The first regulating member 31a is pivotably supported by the support part 34b (first support part). The second regulating member 32a is pivotably supported by the support part 34a (second support part). The mounting device 1a is configured to pinch the leads 65 by the first regulating member 31a and the second regulating member 32a.

In order to pivot the first regulating member 31a centering on the rotation shaft 35b (first rotation shaft), a flexible wire 36 (first connecting member) is attached to the first regulating member 31a. By pulling the first regulating member 31a through the wire 36, the first regulating member 31a is pivoted centering on the rotation shaft 35b. The wire 36 includes an inward movement wire 36a (inward first connecting member) for moving the first regulating member 31a from a state where the first regulating member 31a is oriented vertically downward to a state where the first regulating member 31a is oriented inwardly, and an outward movement wire 36b (outward first connecting member) for moving the first regulating member 31a from the state where the first regulating member 31a is oriented vertically downward to a state where the first regulating member 31a is oriented outwardly. By pulling the inward movement wire 36a upward, the first regulating member 31a is pivoted upwardly centering on the rotation shaft 35b so that the first regulating member 31a is moved into the inwardly oriented state. Moreover, by pulling the outward movement wire 36b upward, the first regulating member 31a is pivoted downwardly centering on the rotation shaft 35b so that the first regulating member 31a is moved into the comparatively outwardly oriented state. Thus, the wire 36 includes the inward movement wire 36a for pivoting the first regulating member 31a inwardly, and the outward movement wire 36b for pivoting the first regulating member 31a outwardly. Moreover, a roller 38a for guiding the inward movement wire 36a is provided to the support part 34b.

Similarly, in order to pivot the second regulating member 32a centering on the rotation shaft 35a (second rotation shaft), a flexible wire 37 (second connecting member) is attached to the second regulating member 32a. By pulling the second regulating member 32a through the wire 37, the second regulating member 32a is pivoted centering on the rotation shaft 35a. The wire 37 includes an inward movement wire 37a (inward second connecting member) for moving the second regulating member 32a from a state where the second regulating member 32a is oriented vertically downward to a state where the second regulating member 32a is oriented inwardly, and an outward movement wire 37b (outward second connecting member) for moving the second regulating member 32a from a state where the second regulating member 32a is oriented vertically downward to a state where the second regulating member 32a is oriented outwardly. By pulling the inward movement wire 37a upward, the second regulating member 32a is pivoted upwardly centering on the rotation shaft 35a so that the second regulating member 32a is moved into the inwardly oriented state. Moreover, by pulling the outward movement wire 37b upward, the second regulating member 32a is pivoted downwardly centering on the rotation shaft 35a so that the second regulating member 32a is moved into the comparatively outwardly oriented state. Thus, the wire 37 is provided with the inward movement wire 37a for pivoting the second regulating member 32a inwardly, and the outward movement wire 37b for pivoting the second regulating member 32a outwardly. Moreover, a roller 38b for guiding the inward movement wire 37a is provided to the support part 34a.

Figure 12A:
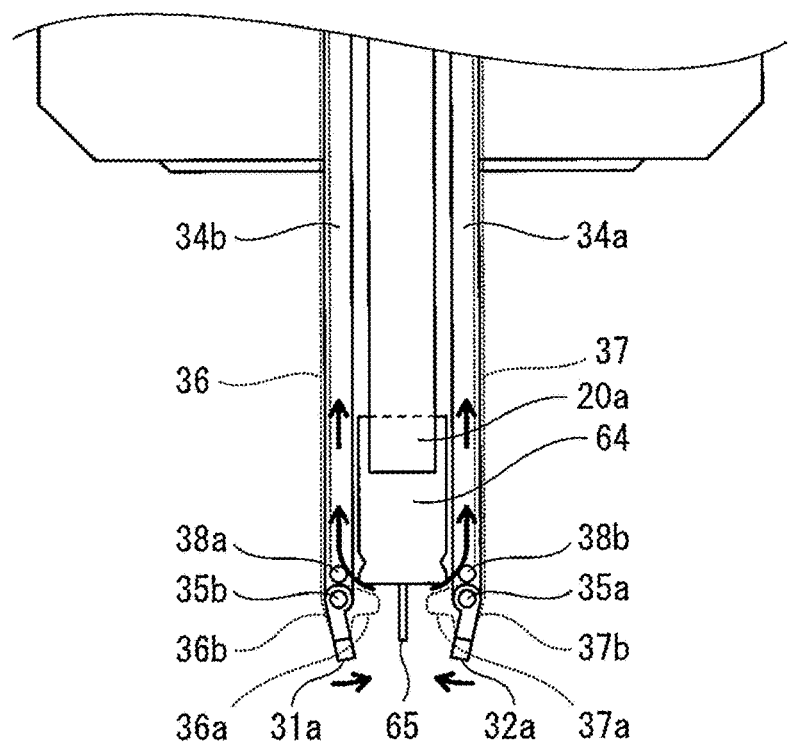
FIG. 12A is a front view of the mounting device of FIG. 10 in a state where a regulating part does not regulate positions of leads of the electronic component.
Figure 12B:
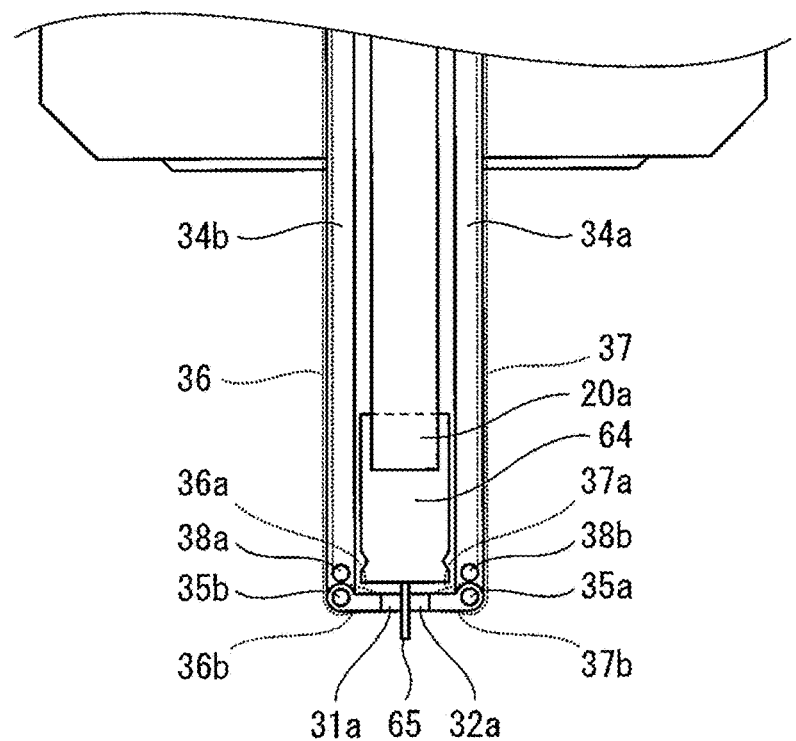
FIG. 12B is a front view in a state where the regulating part regulates the positions of the leads of the electronic component.

A front view of the mounting device 1a in a state where the first regulating member 31a and the second regulating member 32a are opened and do not regulate the positions of the leads 65 is illustrated in FIG. 12A. Moreover, a front view of the mounting device 1a in a state where the first regulating member 31a and the second regulating member 32a are closed and regulate the positions of the leads 65 is illustrated in FIG. 12B.

In the state illustrated in FIG. 12A, the first regulating member 31a and the second regulating member 32a are in the state where they are opened, and the pulling forces do not act on the inward movement wire 36a attached to the first regulating member 31a and the inward movement wire 37a attached to the second regulating member 32a. In order to move the first regulating member 31a and the second regulating member 32a so that the state transitions from the state illustrated in FIG. 12A to the state where the first regulating member 31a and the second regulating member 32a are closed as illustrated in FIG. 12B, the inward movement wire 36a and the inward movement wire 37a are pulled upward in the direction illustrated by arrows in FIG. 12A.

At this time, the inward movement wire 36a and the inward movement wire 37a are connected to the first regulating member 31a and the second regulating member 32a, while being guided by the rollers 38a and 38b. Therefore, the first regulating member 31a and the second regulating member 32a are raised by the inward movement wire 36a and the inward movement wire 37a, and the first regulating member 31a and the second regulating member 32a are pivoted upwardly centering on the rotation shafts 35a and 35b.

When the first regulating member 31a and the second regulating member 32a are pivoted centering on the rotation shafts 35a and 35b, and the first regulating member 31a and the second regulating member 32a contact the leads 65 and reach positions where they can regulate the radial positions of the leads 65, the pivoting movement of the first regulating member 31a and the second regulating member 32a are stopped.

Therefore, the first regulating member 31a and the second regulating member 32a can pinch the leads 65 from both sides having the leads 65 of the electronic component 63 therebetween. At this time, the first regulating member 31a and the second regulating member 32a pinch the leads 65 by contacting the leads 65 in a state where they oppose each other. Therefore, the radial positions of the leads 65 can be regulated. In this embodiment, as illustrated in FIG. 11, the respective positions of the two leads 65 can be regulated by pinching the two leads 65 with the first regulating member 31a and the second regulating member 32a.

The support parts 34a and 34b can move relatively to the holding part 20a. In this embodiment, the holding part 20a is movable with respect to the support parts 34a and 34b, while the support parts 34a and 34b are stopped. That is, in this embodiment, the holding part 20a is movable in the axial direction of the electronic component 63, in other words, the holding part 20a is movable in the vertical direction.

Moreover, although not illustrated, the mounting device 1a is provided with a moving mechanism which moves the holding part 20a. By the moving mechanism moving the holding part 20a, the holding part 20a is moved with respect to the support parts 34a and 34b.

Since the holding part 20a is movable with respect to the support parts 34a and 34b, the holding part 20a is movable to the first regulating member 31a and the second regulating member 32a. Therefore, the positions at which the first regulating member 31a and the second regulating member 32a regulate the leads 65 by contacting the leads 65 are changeable. Thus, in this embodiment, by moving the holding part 20a relative to the support part 34b and the support part 34a, it is possible to move the regulating positions of the leads 65. By moving the holding part 20a, the regulating positions of the leads 65 can be moved.

Figure 13A:
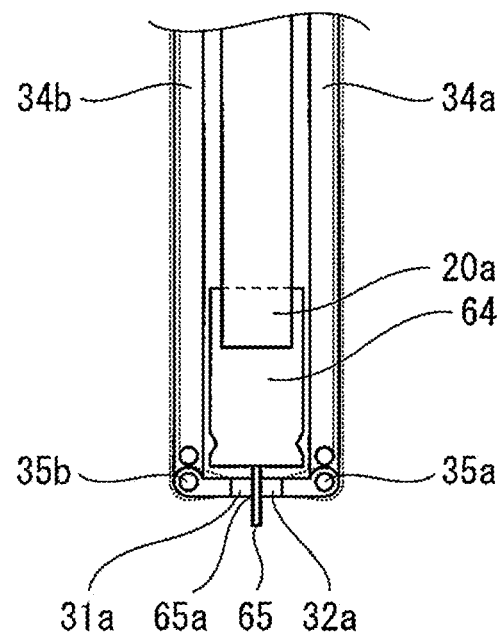
FIG. 13A is a front view of the mounting device of FIG. 10 in a state where the regulating part regulates positions of the leads of the electronic component comparatively close to the holding part.
Figure 13B:
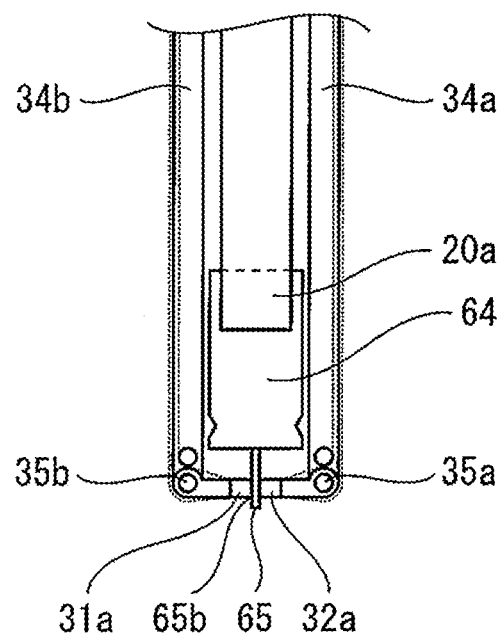
FIG. 13B is a front view in a state where the regulating part regulates positions of the leads of the electronic component comparatively distant from the holding part.

A front view of the mounting device 1a in a state where the first regulating member 31a and the second regulating member 32a regulate the positions of the leads 65 by contacting parts 65a of the leads 65 comparatively close to the holding part 20a is illustrated in FIG. 13A. A front view of the mounting device 1a in a state where the first regulating member 31a and the second regulating member 32a regulate the positions of the leads 65 by contacting parts 65b of the leads 65 comparatively distant from the holding part 20a is illustrated in FIG. 13B.

As illustrated in FIG. 13A, the first regulating member 31a and the second regulating member 32a contact the leads 65 at the parts 65a comparatively close to the body part 64 of the held electronic component 63, and regulate the radial positions of the leads 65 at the parts 65a comparatively close to the body part 64 of the electronic component 63. That is, the radial positions of the leads 65 are regulated at the parts 65a comparatively close to the holding part 20a.

Then, the positions where the first regulating member 31a and the second regulating member 32a contact the leads 65 can be changed by moving the holding part 20a. In detail, by raising the holding part 20a, the positions of the leads 65 where the first regulating member 31a and the second regulating member 32a contact are lowered. By lowering the positions of the leads 65 at which the first regulating member 31a and the second regulating member 32a contact, the radially regulating positions of the leads 65 are lowered. Thus, as illustrated in FIG. 13B, the first regulating member 31a and the second regulating member 32a contact the parts 65b of the leads 65 comparatively distant from the holding part 20a, and the first regulating member 31a and the second regulating member 32a regulate the positions of the leads 65 at the positions comparatively distant from the holding part 20a.

Thus, since the first regulating member 31a and the second regulating member 32a regulate the positions of the leads 65 at the different positions from the holding part 20a, the radial positions of the leads 65 can be regulated at a plurality of positions. Moreover, by moving the holding part 20a to slidingly move the leads 65, the radial positions of the leads 65 can be regulated throughout the length of the leads 65. Therefore, the positioning of the leads 65 in the radial direction can be performed throughout the length of the leads 65. Since the leads 65 can be positioned, the leads 65 can be easily inserted into the insertion holes formed in the substrate by placing the mounting device 1a at a given position of the substrate, while the mounting device 1a holding the electronic component 63. Therefore, the electronic component 63 can be accurately mounted onto the substrate, and the electronic component 63 can be quickly mounted onto the substrate. The mounting of the electronic component 63 onto the substrate can be performed by similar processes as the processes of FIG. 9 in the first embodiment.

Moreover, in the second embodiment, the positions of the leads 65 are regulated by pivoting the first regulating member 31a and the second regulating member 32a centering on the rotation shafts 35a and 35b. Therefore, the positions of the leads 65 can be regulated, without moving the support parts 34a and 34b horizontally (in the surface direction of the substrate). Therefore, when positioning the leads 65, the space occupied by the mounting device 1a can be reduced.

Normally, on the substrate, various electronic components are mounted within a certain space. If the space occupied by the mounting device 1a is large, the mounting device 1a interferes with the electronic components on the substrate when mounting an electronic component, and therefore, the electronic component to be mounted from now may be unable to be placed at a desired location. Moreover, when mounting the electronic component, the mounting device 1a contacts the electronic components on the substrate, which may affect the accuracy of wiring of the electronic components.

In the mounting device 1a of the second embodiment, since the space occupied by the mounting device 1a can be reduced, it can be reduced that the mounting device 1a interferes with the electronic components on the substrate. Therefore, the electronic component can be mounted at the desired position, and the electronic component can be mounted with a higher degree of freedom. Moreover, the electronic components can be mounted with a high density.

Moreover, since it can be reduced that the mounting device 1a contacts the electronic components on the substrate when mounting the electronic component, the mounting can be performed with higher accuracy.

Note that, although in this embodiment the holding part moves to the stationary regulating part, the present disclosure is not limited to this embodiment. The regulating part may move to the stationary holding part. Other configurations may be applied, as long as the regulating part can move the regulating positions of the leads by the holding part and the regulating part moving relatively to each other while the holding part holding the electronic component.

Effect of the Disclosure

According to the present disclosure, when an electronic component is held, a position of a lead of the electronic component can be regulated by a device with a simple configuration. Therefore, the position of the lead of the electronic component can be recognized with the simple configuration and the electronic component can be mounted based on the recognized position of the lead, and therefore, the manufacturing cost of the device can be reduced.

DESCRIPTION OF REFERENCE CHARACTERS

20 Holding Part
30 Regulating Part
The invention claimed is:
1. A mounting device, comprising:
a holding structure including a first holding structure and a second holding structure that are configured to hold an electronic component;
a body structure provided with a first protrusion and a second protrusion; and
a regulating structure configured to regulate a radial position of a lead of the electronic component,
wherein the regulating structure is configured to regulate the position of the lead at a first location, and is configured to regulate the position of the lead at a second location more distant from the first location,
wherein, by the holding structure and the regulating structure moving relative to each other while the holding structure holds the electronic component, the regulating structure moves between a position at which the position of the lead is regulated at the first location and a position at which the position of the lead is regulated at the second location,
wherein the regulating structure includes a first pinching structure and a second pinching structure, and the position of the lead is regulated by pinching the lead between the first pinching structure and the second pinching structure,
wherein the first holding structure and the second holding structure are always located within a space defined by the first pinching structure and the second pinching structure, and the first pinching structure and the second pinching structure are curved so that a portion of the first pinching structure and a portion of the second pinching structure are located directly below the first holding structure and the second holding structure, and
wherein the first holding structure has a first taper surface and the second holding structure has a second taper surface, and the first protrusion interacts with the first taper surface and the second protrusion interacts with the second taper surface to cause the first holding structure and the second holding structure to open and close.

2. The mounting device of claim 1, wherein the regulating structure has an insertion hole at a location where the first pinching structure and the second pinching structure pinch the lead, the lead being insertable into the insertion hole.

3. The mounting device of claim 1, comprising an actuator configured to move the holding structure,
wherein, by moving the holding structure in a direction away from the regulating structure while the holding structure holds the electronic component, the holding structure and the regulating structure separate from each other.

4. The mounting device of claim 2, comprising an actuator configured to move the holding structure,
wherein, by moving the holding structure in a direction away from the regulating structure while the holding structure holds the electronic component, the holding structure and the regulating structure separate from each other.

5. The mounting device of claim 3, comprising:
a spring to maintain a state where the holding structure is opened; and
a taper structure is formed in the holding structure,
wherein the holding structure is in an open state when the holding structure is in contact with the first and the second protrusions at the taper structure, and
wherein when the holding structure moves in a direction away from the regulating structure, the holding structure contacts the first and the second protrusions at a position separated from the taper structure so that the holding structure is closed and holds the electronic component.

6. The mounting device of claim 3,
wherein the regulating structure has an insertion hole at a location thereof where the first pinching structure and the second pinching structure pinch the lead, the lead being insertable into the insertion hole, and
wherein the holding structure moves in a direction away from the regulating structure, while the lead is inserted into the insertion hole.

7. The mounting device of claim 5,
wherein the regulating structure has an insertion hole at a location where the first pinching structure and the second pinching structure pinch the lead, the lead being insertable into the insertion hole, and
wherein the holding structure moves in a direction away from the regulating structure, while the lead is inserted into the insertion hole.

8. The mounting device of claim 1, wherein the first pinching structure is pivotable centering on a first rotation shaft and the second pinching structure is pivotable centering on a second rotation shaft, and wherein the first pinching structure and the second pinching structure pinch the lead and regulate the position of the lead by contacting each other while opposed to each other.

9. The mounting device of claim 8, wherein the first pinching structure is pivotably supported by a first support and the second pinching structure is pivotably supported by a second support, and wherein the regulating position of the lead is moved by moving the holding structure relative to the first support and the second support.

10. The mounting device of claim 9, comprising an actuator configured to move the holding structure, wherein the regulating position of the lead is moved by moving the holding structure.

11. The mounting device of claim 9, wherein a first connector is attached to the first pinching structure and a second connector having flexibility is attached to the second pinching structure, wherein the first pinching structure is pivoted by pulling the first pinching structure through the first connector and the second pinching structure is pivoted by pulling the second pinching structure through the second connector.

12. The mounting device of claim 10, wherein a first connector is attached to the first pinching structure and a second connector having flexibility is attached to the second pinching structure, wherein the first pinching structure is pivoted by pulling the first pinching structure through the first connector and the second pinching structure is pivoted by pulling the second pinching structure through the second connector.

13. A mounting device, comprising:

a holding structure including a first holding structure and a second holding structure that are configured to hold an electronic component;

a body structure provided with a first protrusion and a second protrusion; and a regulating structure configured to regulate a radial position of a lead of the electronic component, wherein the regulating structure is configured to regulate the position of the lead at a first location, and is configured to regulate the position of the lead at a second location more distant from the first location, wherein, by the holding structure and the regulating structure moving relative to each other while the holding structure holds the electronic component, the regulating structure moves between a position at which the position of the lead is regulated at the first location and a position at which the position of the lead is regulated at the second location, wherein the regulating structure includes a first pinching structure and a second pinching structure, and the position of the lead is regulated by pinching the lead between the first pinching structure and the second pinching structure, wherein the first holding structure and the second holding structure are always located within a space defined by the first pinching structure and the second pinching structure, and the first pinching structure and the second pinching structure are curved so that a portion of the first pinching structure and a portion of the second pinching structure are located directly below the first holding structure and the second holding structure, wherein the first holding structure has a first taper surface and the second holding structure has a second taper surface, and the first protrusion interacts with the first taper surface and the second protrusion interacts with the second taper surface to cause the first holding structure and the second holding structure to open and close, wherein a first connector is attached to the first pinching structure and a second connector having flexibility is attached to the second pinching structure, wherein the first pinching structure is pivoted by pulling the first pinching structure through the first connector and the second pinching structure is pivoted by pulling the second pinching structure through the second connector, wherein the first connector includes an inward first connector configured to pivot the first pinching structure inward, and an outward first connector configured to pivot the first pinching structure outward, and wherein the second connector includes an inward second connector configured to pivot the second pinching structure inward, and an outward second connector configured to pivot the second pinching structure outward.

14. The mounting device of claim 1, wherein the mounting device is a hand of a robot.

15. A mounting device, comprising:

a holder to hold an electronic component; and a regulating structure configured to regulate a radial position of a lead of the electronic component, wherein the regulating structure is configured to regulate the position of the lead at a first location, and is configured to regulate the position of the lead at a second location more distant from the first location, wherein, by the holder and the regulating structure moving relative to each other while the holder holds the electronic component, the regulating structure moves between a position at which the position of the lead is regulated at the first location and a position at which the position of the lead is regulated at the second location, wherein the regulating structure includes a first pinching structure and a second pinching structure, and the position of the lead is regulated by pinching the lead between the first pinching structure and the second pinching structure, wherein a first connector is attached to the first pinching structure and a second connector having flexibility is attached to the second pinching structure, wherein the first pinching structure is pivoted by pulling the first pinching structure through the first connector and the second pinching structure is pivoted by pulling the second pinching structure through the second connector, wherein the first connector includes an inward first connector configured to pivot the first pinching structure inward, and an outward first connector configured to pivot the first pinching structure outward, and wherein the second connector includes an inward second connector configured to pivot the second pinching structure inward, and an outward second connector configured to pivot the second pinching structure outward.

* * * * *